United States Patent
Zhang et al.

(10) Patent No.: US 7,297,399 B2
(45) Date of Patent: *Nov. 20, 2007

(54) THERMAL TRANSPORT STRUCTURE AND ASSOCIATED METHOD

(75) Inventors: Jian Zhang, Schenectady, NY (US); Sandeep Shrikant Tonapi, Niskayuna, NY (US); Ryan Christopher Mills, Rexford, NY (US); Arun Virupaksha Gowda, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 101 days.

This patent is subject to a terminal disclaimer.

(21) Appl. No.: 11/247,114

(22) Filed: Oct. 11, 2005

(65) Prior Publication Data

US 2007/0231560 A1    Oct. 4, 2007

(51) Int. Cl.
B32B 27/12 (2006.01)
(52) U.S. Cl. .................. 428/339; 428/408; 428/411.1; 361/704
(58) Field of Classification Search .................. 361/713
See application file for complete search history.

(56) References Cited

U.S. PATENT DOCUMENTS

| | | | | |
|---|---|---|---|---|
| 3,404,061 A | * | 10/1968 | Bochman et al. | 428/143 |
| 5,958,572 A | | 9/1999 | Schmidt et al. | |
| 6,048,919 A | * | 4/2000 | McCullough | 524/404 |
| 6,075,701 A | | 6/2000 | Ali et al. | |
| 6,131,651 A | * | 10/2000 | Richey, III | 165/185 |
| 6,407,922 B1 | * | 6/2002 | Eckblad et al. | 361/704 |
| 6,462,410 B1 | | 10/2002 | Novotny et al. | |
| 6,689,471 B2 | | 2/2004 | Gandi et al. | |
| 6,746,768 B2 | | 6/2004 | Greinke et al. | |
| 2001/0038909 A1 | * | 11/2001 | Mercuri et al. | 428/325 |
| 2003/0117770 A1 | * | 6/2003 | Montgomery et al. | 361/687 |
| 2005/0064230 A1 | | 3/2005 | Sayir et al. | |
| 2005/0111189 A1 | | 5/2005 | Smaic et al. | |

OTHER PUBLICATIONS

Ren et al., Synthesis of Large Arrays of Well-Aligned Carbon Nanotubes on Glass, Nov. 6, 1998, Science, vol. 282, pp. 1105-1107.*
TPG Thermal Management Material, Sep. 2003, Genersl Electric Company.*
Co-pending application entitled "Thermal Management System and Associated Method", filed on Oct. 11, 2005.

* cited by examiner

*Primary Examiner*—Carol Chaney
*Assistant Examiner*—Elizabeth Robinson
(74) *Attorney, Agent, or Firm*—Shawn A. McClintic; William E. Powell, III

(57) ABSTRACT

A thermal transport structure having a thermal transport layer and a resin layer is provided. The thermal transport layer may include a first surface and a second surface, and having a thermally conductive material disposed in the thermal transport layer, where the thermally conductive material is oriented in a predetermined direction in order to facilitate heat conduction relative to the predetermined direction. Further, the resin layer is secured to the thermal transport layer second surface, where the resin layer is relatively less thermally conductive than the thermal transport layer.

24 Claims, 7 Drawing Sheets

THERMAL TRANSPORT STRUCTURE AND ASSOCIATED METHOD

STATEMENT REGARDING FEDERALLY SPONSORED RESEARCH & DEVELOPMENT

This invention was made with Government support under contract number 70NANB2H3034 awarded by U.S. National institute of Standards and Technology. The Government may have certain rights in the invention.

BACKGROUND

1. Technical Field

The invention includes embodiments that may relate to a thermal transport structure. The invention includes embodiments that may relate to a method of making and/or using the thermal transport structure.

2. Discussion of Related Art

Some electronic devices generate heat during operation that may need to be dissipated. As electronic devices become denser and more highly integrated, the heat flux requirement may increase. Because of performance and reliability considerations, the devices may need to operate at lower temperatures. The operating temperature requirement may reduce the temperature difference between the heat-generating device and the ambient temperature, which may decrease the thermodynamic driving force for heat removal. The increased heat flux and reduced thermodynamic driving force may require a thermal management technique to facilitate heat removal during operation.

Thermal management techniques may use some form of heat-dissipating unit (e.g., a heat spreader, heat sink, lid, or heat pipe) to conduct heat away from high temperature areas in an electronic device. A heat-dissipating unit may include a thermally conductive material that is mechanically coupled to a heat-generating unit to aid in heat removal from the heat-generating unit. A dissipating unit may include a metal article in contact with the heat-generating unit, such as a heat radiator fin. Heat from the heat-generating unit may flow through the mechanical interface between the units into the heat-dissipating unit.

In an electronic package, a heat-dissipating unit may be mechanically coupled to the heat producing component during operation by positioning a flat surface of the heat-dissipating unit against a flat surface of the heat producing component and holding the heat-dissipating unit in place using some form of adhesive or fastener. A heat-dissipating unit may be attached to the heat-generating component via a thin-layer of thermal interface material (TIM). This material may be a filled polymer system. The effectiveness of heat removal from the device may depend on the in-situ thermal resistance of the TIM material, which may depend on the bulk thermal conductivities of the TIM material. While, the usage of thermal interface material may provide mechanical stability compared to adhesives, thermal resistance may be exacerbated by the bulk of the thermal interface material.

It may be desirable to obtain a structure and/or method for thermal transport than might not otherwise be available. It may be desirable to obtain a structure and/or method for thermal transport having relatively improved thermal transport performance. It may be desirable to obtain a structure and/or method with a relatively higher thermal conductivity in a pre-determined direction than might otherwise be available.

BRIEF DESCRIPTION

In one embodiment, a thermal transport structure is provided. The thermal transport structure may include a thermal transport layer having a first surface and a second surface, and having a thermally conductive material disposed in the thermal transport layer, where the thermally conductive material is oriented in a predetermined direction in order to facilitate heat conduction relative to the predetermined direction. Further, the thermal transport structure may also include a resin layer secured to the thermal transport layer second surface, where the resin layer is relatively less thermally conductive than the thermal transport.

In one embodiment, a thermal management system is provided. The system may include a heat-generating unit, a heat-dissipating unit, and a thermal transport structure located between the heat-generating unit and the heat-dissipating unit. The thermal transport structure may include one or more thermal transport layers, with each thermal transport layer defining a thermal conduction pathway from the heat-generating unit to the heat-dissipating unit, and one or more resin layers disposed in an alternating array with the thermal transport layers.

In one embodiment, a pre-formed structure for transporting thermal energy is provided. The structure may include a resin layer having a first surface and a second surface, and one or more discontinuous portions of thermal transport layers that extend from the resin layer first surface through the resin layer to the resin layer second surface.

BRIEF DESCRIPTION OF THE DRAWINGS

These and other features and aspects may be apparent in view of the detailed description and accompanying drawing figures in which like reference numbers represent parts that are the same, or substantially the same, from figure to figure.

DETAILED DESCRIPTION

Figure 1:
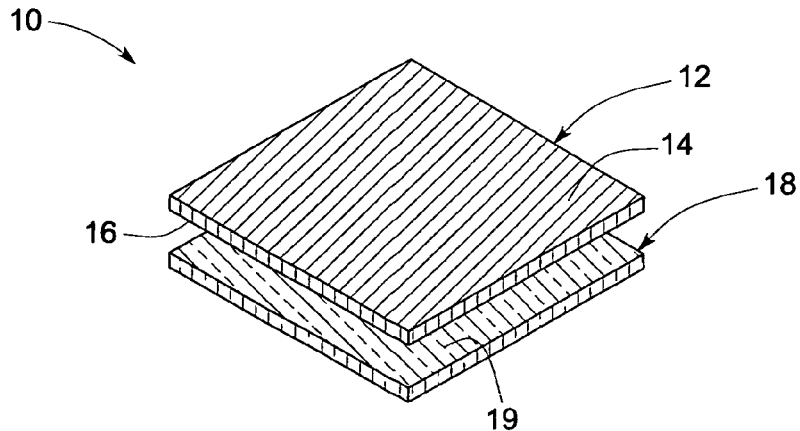
FIG. 1 is a schematic view of a thermally conductive layer disposed over a resin layer.

The invention includes embodiments that may relate to a thermal transport structure. The invention includes embodiments that may relate to a method of making and/or using the thermal transport structure. The invention may include embodiments that relate to a thermal management system.

As used herein, a term thermal transport structure may refer to an engineered structure for use in an electronic assembly. Thermally conductive may include the ability to conduct heat, and may refer to a physical constant for a quantity of heat that may pass through a predetermined volume in a unit of time, for units involving a difference in temperature across the volume. Tack free may refer to a surface that does not possess pressure sensitive adhesive properties at about room temperature. By one measure, a tack free surface will not adhere or stick to a finger placed lightly in contact therewith at about 25 degrees Celsius. Solid refers to a property such that a material does flow perceptibly under moderate stress, or has a definite capacity for resisting one or more forces (e.g., compression or tension) that may otherwise tend to deform it. In one aspect, under ordinary conditions a solid may retain a definite size and shape. The term "free" may be used in combination with a term, and may include insubstantial or trace amounts while still being considered free of the modified term. For example, free of solvent or solvent-free, and like terms and phrases, may include a significant portion, some, or all of the solvent having been removed, for example, during B-staging. B-staging a resin layer, and related terms and phrases, may include one or more of heating for a predetermined amount of time, optionally under vacuum; removing some or all of a solvent; at least partially solidifying the material; and/or advancing the cure or cross-linking of a curable resin from an uncured state to a partially, but not completely, cured state.

Approximating language, as used herein throughout the specification and claims, may be applied to modify any quantitative representation that could permissibly vary without resulting in a change in the basic function to which it is related. Accordingly, a value modified by a term or terms, such as "about", may not to be limited to the precise value specified. In at least some instances, the approximating language may correspond to the precision of an instrument for measuring the value.

In one embodiment, a thermal transport structure is provided. The thermal transport structure may include a thermal transport layer having a first surface and a second surface. The thermal transport layer may have a thermally conductive material disposed within. The thermally conductive material may be oriented in a predetermined direction in order to facilitate heat conduction relative to the predetermined direction. The thermal transport structure may include a resin layer secured to the thermal transport layer second surface, and the resin layer may be relatively less thermally conductive than the thermal transport layer.

In some embodiments of the invention, the thermally conductive material may have anisotropic thermal conductivity. That is to say, the thermally conductive material of the thermal transport layer may have a relatively higher value of thermal conductivity in a preferred direction. The plane having relatively higher thermal conductivity values may be employed to transfer heat from one object to another while offering lesser thermal resistance as compared to other planes. For example, the thermally conductive material may be oriented in a predetermined direction in order to facilitate heat conduction between the heat sink and the heat spreader in a thermal management system through the plane having higher thermal conductivity.

Suitable thermally conductive material may include one or more of alumina, boron nitride, silica, talc, zinc oxide, and the like. Other suitable thermally conductive material may include a metal particulate. Suitable metals may include one or more of indium, aluminum, gallium, boron, phosphorus, silver or tin. The metal particulate may include an alloy, oxide, nitride or the like of one or more of the foregoing metals. In one embodiment, the thermally conductive material may include one or both of aluminum nitride or boron nitride.

In some embodiments of the invention, the thermally conductive material may be coated. Suitable coatings may affect one or more attributes of the thermally conductive material, or of the resulting thermal transport structure. Such attributes may include one or more of thermal conductivity, electrical conductivity, bond-line thickness, cohesion, adhesion, transparency, workability, and the like. Liquid metals, as discrete particles or as a coating on other particles, may be used in embodiments of the invention. In one embodiment, the thermally conductive material may be coated with, for example, a silver coating or a gallium coating.

The thermally conductive material may have an average particle diameter that may be selected to control the spacing of layers adjoining the layer in which the particles are disposed. That is, the particles may function as both a spacer and as a thermally conductive filler. In one embodiment, the thermally conductive material may have an average particle diameter in a range of from about 1 nanometer to about 25 nanometers, from about 25 nanometers to about 50 nanometers, from about 50 nanometers to about 100 nanometers, from about 100 nanometers to about 1 micrometer, from about 1 micrometer to about 10 micrometers, from about 10 micrometer to about 100 micrometers, from about 100 micrometers to about 500 micrometers, or greater than about 500 micrometers. The particle size distribution (PSD) may be selected so that the particles are of uniform size and shape, or may be selected as a multi-modal distribution. For multi-modal distributions, the particles may be selected to achieve a pre-determined packing configuration (with the smaller particles filling the gaps defined by the larger particles). In one embodiment, the particles of one of the modes may differ not only in size, but also in shape and/or composition.

In one embodiment, the thermally conductive material may include thermal pyrolytic graphite (TPG). In one embodiment, the thermally conductive material may consist essentially of TPG. The TPG may be oriented in a predetermined direction relative to a desired thermal flow path. The in-plane thermal conductivity of the TPG material may be higher than the thermal conductivity in the through plane direction. By cladding the desired thermal flow path with relatively less thermally conductive material, the desired thermal flow path may be defined further and the thermal energy transport may be controlled further.

The thermally conductive material may be present in the thermal transport layer in an amount in a range of greater than about 1 weight percent, based on the weight of the thermal transport layer. In one embodiment, thermally conductive material may be present in an amount in a range of from about 1 weight percent to about 10 weight percent, from about 10 weight percent to about 15 weight percent, from about 15 weight percent to about 25 weight percent, from about 25 weight percent to about 50 weight percent, from about 50 weight percent to about 75 weight percent, from about 75 weight percent to about 85 weight percent, from about 85 weight percent to about 95 weight percent, or greater than about 95 weight percent, based on the total weight of the thermal transport layer. In one embodiment, thermally conductive material may be present in an amount of about 100 weight percent, based on the weight of the thermal transport layer. The amount may be adjusted, selected, or determined based on, for example, application specific parameters.

The thermal transport layer may either be a continuous layer, or may include a plurality of individual thermally conductive strips that may be disposed in an alternating array with a plurality of individual non-thermally conductive strips having a relatively low thermal conductivity. Depending on the availability of the material and the thermal requirements of a system alternatively, the thermal transport layer may be employed in the thermal transport structure in various other forms, such as blocks, bars, cylinders, geometric shapes such as hexagons, and the like. For example, more thermal transport will require relatively larger cross section of the thermal transport layer.

In some embodiments of the invention, the thickness of the thermal transport layer may be in a range of from about 250 micrometers to about 500 micrometers, from about 500 micrometers to about 750 micrometers, from about 750 micrometers to about 1000 micrometers, from about 1000 micrometers to about 1500 micrometers, from about 1500 micrometers to about 2000 micrometers, or greater than about 2000 micrometers. In cases where the thermal transport layer is not continuous, the individual portions may have differing thickness. The thickness of these individual portions may differ from each other, and may be in a range of from about 100 micrometers to about 200 micrometers, from about 200 micrometers to about 240 micrometers, from about 240 micrometers to about 260 micrometers, from about 260 micrometers to about 300 micrometers, from about 300 micrometers to about 350 micrometers, from about 350 micrometers to about 500 micrometers, or greater than about 500 micrometers. The thickness of the thermal transport layer may be selected with reference to the system requirements, such as heat generation and operating temperatures.

The thickness of the thermal transport layer may be calculated based upon the required thickness of the thermal transport structure, which in turn may depend on factors, such as the dimensions of the devices, and the types of heat-generating and heat-dissipating devices. Further, the thickness of the thermal transport layer may also be based upon the overall thermal resistance requirement of the thermal transport structure. The thermal resistance of the thermal transport structure may depend upon the thermal resistance of the thermal transport layer as well as the resin layer. In some embodiments, the bulk resistance of the thermal transport layer having a thickness of about 1000 micrometers, or less, may be about 1 $mm^2$-K/w; of about 500 micrometers, or less, may be about 1 $mm^2$-K/w; or of about 1000 micrometers, or less, may be about 5 $mm^2$-K/w.

In some embodiments of the invention, the thermal transport layer may also include a binder. The binder may facilitate one or more of adhesion between a resin layer and the thermal transport layer, cohesion of the thermal transport layers, water resistance, and the like. Suitable binders may include the materials disclosed herein for use as the resin layer. In one embodiment, the binder may include one or more oxirane, such as an epoxy. The binder may be selected based on compatibility (or in some cases its incompatibility) with the resin layer. Where distinct layer boundary definitions may be desirable, incompatible or non-miscible materials may be used as the binder and the resin layer.

The binder may be present in an amount greater than about 5 volume percent of the total volume of the thermal transport layer. In one embodiment, the binder may be present in a range of from about 5 volume percent to about 10 volume percent, from about 10 volume percent to about 15 volume percent, from about 15 volume percent to about 20 volume percent, or greater than about 20 volume percent. In one embodiment, the binder may be present in an amount of less than about 20 volume percent of the total volume of the thermal transport layer.

The binder may include additives which may affect one or more attributes of the thermal transport layer, such as minimum width, viscosity, cure profile, adhesion, electrical properties, thermal properties (e.g., thermal conductivity), chemical resistance (e.g., moisture resistance, solvent resistance), glass transition, thermal conductivity, heat distortion temperature, and the like.

The thermal transport structure may include the resin layer, which may be less conductive relative to the thermal transport layer. The resin layer may be secured to the thermal transport layer second surface. In case of individual conductive portions of the thermal transport layer, the resin layer may be used to hold the individual portions together to form the thermal transport structure.

The resin layer may thermally insulate individual thermal transport layers, or strips from each other. The resin layer may resist thermal transport to define a path for the thermal energy. The path may direct the thermal energy in a predetermined direction.

The resin layer may define a plurality of differing forms, such as strips, blocks, bars, cylinders, geometric shapes such as hexagons, and the like. The resin layer may surround the thermal transport layer, and may separate out an individual thermal transport layer from another layer or layers to reduce heat transfer between individual thermal transport layers. Otherwise a transfer of heat between individual thermal transport layers may happen in a direction other than a preferred direction of thermal transport.

A resin layer according to embodiments of the invention may include one or more curable (e.g., cross-linkable) resin. Suitable resins may include aromatic, aliphatic and cycloaliphatic resins. Resins may be described throughout the specification and claims either as a specifically named resin or as a composition, monomer or molecule having a moiety of the named resin.

In one embodiment, the resin layer may include one or more of oxirane resin, polydimethylsiloxane resin, acrylate resin, other organo-functionalized polysiloxane resin, polyimide resin, fluorocarbon resin, benzocyclobutene resin, fluorinated polyallyl ether, polyamide resin, polyimidoamide resin, phenol cresol resin, aromatic polyester resin, polyphenylene ether (PPE) resin, cyanate ester, poly urethane, polyvinyl, polyacrylate, polyphenylene oxide, bismaleimide triazine resin, fluoro resin, or the like. Curable and cross-linkable materials may include one or more epoxy resin, acrylate resin, polydimethyl siloxane resin, or other organo-functionalized polysiloxane resin that may cross-link via free radical polymerization, atom transfer, radical polymerization, ring-opening polymerization, ring-opening metathesis polymerization, anionic polymerization, or cationic polymerization.

The oxirane resin may include an organic system or inorganic system with epoxy functionality, or a higher ring number, such as an oxetane. In one embodiment, the epoxy resin may include an aromatic epoxy resin, a cycloaliphatic epoxy resin, aliphatic epoxy resin, or a mixture of two or more thereof.

Useful epoxy resins may include those that may be produced by reaction of a hydroxyl, carboxyl or amine-containing compound with epichlorohydrin in the presence of a basic catalyst, such as a metal hydroxide. Also included may be epoxy resins produced by reaction of a compound containing at least one and two or more carbon-carbon double bonds with a peroxide, such as a peroxyacid.

Suitable aromatic epoxy resins may include one or more novolak epoxy resins. In one embodiment, the epoxy resin may include one or more of bisphenol-A epoxy resin, bisphenol-F epoxy resin, resorcinol diglycidyl ether, biphenyl epoxy resin, or 4,4-biphenyl epoxy resins. In one embodiment, a polyfunctional epoxy resin may include one or both of divinyl benzene dioxide or 2-glycidyl phenyl glycidyl ether. Suitable trifunctional aromatic epoxy resins may include, for example, triglycidyl isocyanurate epoxy.

The resin layer may include a curing agent or hardener. Suitable curing agents may include one or more free radical initiators, such as azo compounds, peroxides, and the like. Suitable azo compounds for the curing agent may include azo-bis-isobutyronitrile. Suitable hardeners, such as unsaturated carboxylic acids or anhydrides, may include one or more of maleic acid, fumaric acid, citaconic acid, chloromaleic acid allyl succinic acid, itaconic acid, mesaconic acid, and anhydrides thereof.

Suitable peroxides may include one or more organic peroxide, such as those having the formula R—O—O—H or R—O—O—R'. In one embodiment, the organic peroxide may include one or more of diacyl, peroxydicarbonate, monoperoxycarbonate, peroxyketal, peroxyester, or dialkyl peroxide. In one embodiment, the organic peroxide may include one or more of dicumyl peroxide, cumyl hydroperoxide, t-butyl peroxy benzoate, or ketone peroxide. In one embodiment, the peroxide may include hydroperoxide.

The curing agent, if used, may be present in an amount greater than about 0.5 weight percent. In one embodiment, the curing agent may be present in a range of from about 0.1 weight percent to about 0.5 weight percent, from about 0.5 to about 1 weight percent, from about 1 to about 3 weight percent, from about 3 to about 5 weight percent, from about 5 weight percent to about 10 weight percent, from about 10 weight percent to about 15 weight percent, from about 15 weight percent to about 25 weight percent, from about 25 weight percent to about 50 weight percent, or greater than about 50 weight percent, based on the weight of the total resin content.

A cure catalyst may be included in the resin layer. Suitable cure catalysts may include one or more amine, imidazole, imidazolium salt, phosphine, metal salt, or salt of nitrogen-containing compound. A metal salt may include, for example, aluminum acetyl acetonate (Al(acac)$_3$). The nitrogen-containing molecule may include, for instance, amine compounds, di-aza compounds, tri-aza compounds, polyamine compounds and combinations thereof. The acidic compounds may include phenol, organo-substituted phenols, carboxylic acids, sulfonic acids and combinations thereof.

The cure catalyst, if used, may be present in an amount greater than about 0.5 weight percent. In one embodiment, the cure catalyst may be present in a range of from about 0.1 weight percent to about 0.5 weight percent, from about 0.5 to about 1 weight percent, from about 1 to about 3 weight percent, from about 3 to about 5 weight percent, from about 5 weight percent to about 10 weight percent, from about 10 weight percent to about 15 weight percent, from about 15 weight percent to about 25 weight percent, from about 25 weight percent to about 50 weight percent, or greater than about 50 weight percent, based on the weight of the total resin content.

The resin layer may include a solvent. Suitable solvents may include one or more organic solvents, such as 1-methoxy-2-propanol, methoxy propanol acetate, butyl acetate, methoxyethyl ether, methanol, ethanol, isopropanol, ethyleneglycol, ethylcellosolve, methylethyl ketone, cyclohexanone, benzene, toluene, xylene, and cellosolves such as ethyl acetate, cellosolve acetate, butyl cellosolve acetate, carbitol acetate, and butyl carbitol acetate, and combinations thereof. These solvents may be used either singly or in the form of a combination of two or more members. In at least one embodiment, the solvent may be extracted to form a B-staged layer.

In some embodiments, the resin layer, the thermal transport layer, or both may include a thermoplastic resin. In these embodiments, the thermal conductivity of the thermoplastic resin of the thermal transport layer may be more than the thermal conductivity of the thermoplastic resin of the resin layer. The melting point of the thermoplastic resin of the thermal transport layer and the resin layer may be higher that the temperature of the heat-generating and heat-dissipating units during operation, to which the thermal transport structure may be coupled. Suitable thermoplastic resins employed in the thermal transport layer may include polyolefins, such as polyethylene, polypropylene; polycarbonates; or polyesters; or derivatives and halogenated derivatives thereof.

In some embodiments of the invention, adding one or more fillers may increase the thermal conductivity and/or electrical resistivity of the resin layer, the thermal transport layer, or another layer. The fillers may be additional to the thermally conductive materials disclosed with reference to the thermal transport layer. Filler materials or additives may affect one or more attributes of the resin layer, such as minimum width, viscosity, cure profile, adhesion, tack, electrical properties, chemical resistance (e.g., moisture resistance, solvent resistance), glass transition, thermal conductivity, heat distortion temperature, and the like. The filler may be selected for relatively high thermal conductivity, relatively low thermal conductivity, or for a different property or attribute.

Suitable fillers may include the thermally conductive materials, as disclosed herein, as well as additional materials. In one embodiment, the filler may include silica. Suitable silica may include one or more of fused silica, fumed silica, or colloidal silica. The filler may have an average particle diameter of less than about 500 micrometers. In one embodiment, the filler may have an average particle diameter in a range of from about 1 nanometer to about 5 nanometers, from about 5 nanometers to about 10 nanometers, from about 10 nanometers to about 50 nanometers, or greater than about 50 nanometers.

Filler may be treated with a compatiblizing agent, and may be further treated with a passivating agent. A suitable compatiblizing agent may include organoalkoxysilane, and a suitable passivating agent may include a silazane.

Suitable capping agents may include one or more hydroxyl reactive materials, such as silylating agents. Suitable silylating agents may include one or more of hexamethyldisilazane (HMDZ), tetramethyl disilazane, divinyl tetramethyl disilazane, diphenyl tetramethyl disilazane, N-(trimethylsilyl) diethylamine, 1-(trimethylsilyl) imidazole, trimethyl chlorosilane, pentamethyl chloro disiloxane, pentamethyl disiloxane, and the like. In one embodiment, hexamethyldisilazane may be the capping agent.

Suitable filler particles may have differing shapes and sizes that may be selected based on application specific criteria. Suitable shapes may include one or more of spherical particles, semi-spherical particles, rods, fibers, geometric shapes, and the like. The particles may be hollow or solid-cored, or may be porous. Long particles, such as rods and fibers may have a length that differs from a width, and may be directionally orientable relative to a plane defined by the thermal transport layer, orientation may enhance heat transfer from the heat-generating unit or chip to the heat-dissipating unit, or heat sink.

As disclosed hereinabove, in some embodiments the resin layer may be a B-stageable resin. A B-stageable resin refers to a resin composition that may respond to, for example, a B-staging treatment to form one or more of a non-flowable and tack-free layer, a partially polymerized layer, or a solvent free layer. In some embodiments, the material of the resin layer is B-stageable, and in other embodiments, the resin layer has been B-staged. The B-staging may be accomplished, for example, by solvent reduction, partial polymerization, or the like.

B-staging the B-stageable film may be for a sufficient time at a sufficient temperature and a sufficient vacuum to achieve the heat-dissipating component having a B-staged resin film adhered to the heat-dissipating component, where the film may be free of solvent. B-staging of the B-stageable film may be performed at a temperature greater than room temperature. In one embodiment, the B-staging temperature may be in a range of from about 50 degrees Celsius to about 65 degrees Celsius, from about 65 degrees Celsius to about 80 degrees Celsius, from about 80 degrees Celsius to about 220 degrees Celsius, from about 220 degrees Celsius to about 235 degrees Celsius, from about 235 degrees Celsius to about 250 degrees Celsius, or greater than about 250 degrees Celsius. B-staging the B-stageable film may be performed in a period greater than about 30 seconds. In one embodiment, the B-staging time may be in a range of from about 1 minute to about 10 minutes, from about 10 minutes to about 30 minutes, from about 30 minutes to about 60 minutes, from about 60 minutes to about 70 minutes, from about 70 minutes to about 240 minutes, from about 240 minutes to about 270 minutes, from about 270 minutes to about 300 minutes, or greater than about 300 minutes.

B-staging of the B-stageable film may be performed at a controlled pressure. In one embodiment, the pressure may be about ambient pressure. In one embodiment, the pressure may be a negative pressure of less than about 10 mm Hg (millimeters of Mercury), or about 10 Torr. In one embodiment the pressure may be in a range of from about 10 mm Hg (about 10 Torr) to about 50 mm Hg (about 50 Torr), from about 50 mm Hg (about 50 Torr) to about 75 mm Hg (about 75 Torr), from about 75 mm Hg (about 75 Torr) to about 200 mm Hg (about 200 Torr), from about 200 mm Hg (about 200 Torr) to about 225 mm Hg (about 225 Torr), from about 225 mm Hg (about 225 Torr) to about 250 mm Hg (about 250 Torr), or greater than about 250 mm Hg (about 250 Torr). In one embodiment, B-staging may be affected at about 95 degrees Celsius at less than about 10 mm Hg (less than about 10 Torr), for about 90 minutes.

In one embodiment, the pre-formed structure having the B-stageable resin layer and the thermal transport layer may be partially cured to a B-stage, that is, a B-staged film or a B-staged layer. The B-staged film may be processed in the same, or a similar manner, as the thermoplastic film disclosed herein. A B-staged resin layer may be one or more of solid, tack-free, or hard so that a heat transfer surface, having a B-staged resin layer adhered thereto, may be, for example, stored, shipped, stacked, or otherwise handled, and later assembled to an electronic device. As noted above, the composite may be cured to at least partially convert the B-stageable resin to a B-staged resin layer. The B-staging of the resin layer may strengthen the composite, may increase cohesion, may increase workability and/or handle-ability, and/or may decrease tack.

In one embodiment of the invention, the thermal transport layer and the resin layer may be stacked to form a composite. The thermal transport layer may be present in the composite, or stack, in an amount in a range of greater than about 1 weight percent relative to the weight of the resin layer. In one embodiment, the thermal transport layer may be present in an amount in a range of from about 1 weight percent to about 10 weight percent, from about 10 weight percent to about 15 weight percent, from about 15 weight percent to about 25 weight percent, from about 25 weight percent to about 50 weight percent, from about 50 weight percent to about 75 weight percent, from about 75 weight percent to about 85 weight percent, from about 85 weight percent to about 95 weight percent, or greater than about 95 weight percent, based on the total weight of the combination of the thermal transport layer and resin layer. In one embodiment, the thermally conductive material may be present in an amount less than about 99 weight percent based on the total combined weight of the thermal transport layer and the resin layer. In one embodiment, the thermally conductive material may be present in an amount greater than about 50 weight percent based on the total combined weight of the thermal transport layer and the resin layer.

The stacking of the thermal transport layer and the resin layer may include one or more of printing, syringe dispensing, or pick-and-place dispensing of the thermal transport layer on the resin layer. For example, squeezing, roll coating, spraying, or brushing may apply the thermal transport layer to the resin layer, or the resin layer to the thermal transport layer. In one embodiment, printing may include flexographic printing, screen-printing, or stencil printing.

One or both of the thermal transport layer or resin layer may be formed as a film. As a film, the thermal transport structure may be formed by, for example, roll-to-roll processing of the film layers. Suitable films may be formed from, for example, thermoplastic-containing layers or B-staged layers. If the resin layer is a film, disposal or production may include roll coating the thermal transport layer onto the resin layer. Alternatively, if the thermal transport layer is a film, the resin layer may be roll coated over the thermal transport layer. If both, the thermal transport layer and the resin layer are films, the thermal transport structure may be co-extruded, laminated, or the like.

The composite may be cut in a plane skew relative to a plane defined by the thermal transport layer to form a cross-sectional slice. The cut may be made perpendicular to a plane defined by the thermal transport layer. In one embodiment, the cut may be at an angle other than 90 degrees. Suitable other angles may be in a range of from about 1 degree to about 30 degrees, from about 30 degrees to about 45 degrees, from about 45 degrees to about 70 degrees, or from about 70 degrees to less than 90 degrees.

The slice may be cut in a direction that is skew relative to a plane defined by the thermal transport layer or layers. Alternatively, the slicing may include making a perpendicular cut to a plane defined by the thermal transport layer or thermal transport layers. The slice may expose a first end of the thermal transport layer on a first surface of the slice and a second end of the thermal transport layer on a second surface of the slice.

The slice may have a thickness of more than a few micrometers. In one embodiment, the thickness of the slice may be in a range of from about 100 micrometers to about 200 micrometers, from about 200 micrometers to about 250 micrometers, from about 250 micrometers to about 500 micrometers, from about 500 micrometers to about 1000 micrometers, from about 1000 micrometers to about 1500 micrometers, from about 1500 micrometers to about 2000 micrometers, or more than about 2500 micrometers. The thickness may be selected with reference to one or more factors such as the desired end-use application, the integral strength of the slice, the particle size of spacers (if present), and the like.

In one embodiment, the surface of the slice may be subjected to modifying surface treatments. The surface treatments may be used to facilitate adhesion of a surface to an adjacent surface, to increase wetting, to increase surface area, to increase roughness for mechanical adhesion, to increase functionalization of the surface for increased chemical adhesive, or some combination of two or more thereof. In some embodiments, surface modification may include surface treatment to roughen the surface of the thermal transport layers of the slice to couple the slice to other surfaces. For example, mechanical roughening may improve wetting and contact at the interface. Processes such as grinding, bead blast, and the like may also be used as a mechanical roughening process for deliberate modification of a surface. Additional mechanical roughening processes, such as polishing, planarization, or scarification may be employed.

Such surface modification procedures may facilitate increased or effective coupling of the thermal transport structure with one or both of the heat-generating unit or the heat-dissipating unit. "Effective coupling" refers to a formation of an interface between the first end surface or the second end surface, and a surface of the heat-generating unit or the heat-dissipating unit to increase the transfer of thermal energy (i.e., heat transfer) therebetween.

Surface treatments may remove contaminates, or undesirable residue, such as resin, which may be present on the surface of the thermally conductive material of the thermal transport layers. Such removal may decrease the thermal resistance of the thermal transport structure. A combination of the surface modification techniques may also be employed to obtain enhanced adhesion properties.

Chemical etching methods may be employed as surface treatments of the thermal transport structure. Suitable chemical etch methods may include one or more of surface etching or reactive ion etch. Suitable chemical etchants may include one or more acid, one or more base, or one or more salt solution. The acid may include hydrochloric acid, nitric acid, sulfuric acid, phosphoric acid, and the like. The base may include potassium chloride, sodium hydroxide, or hydrogen peroxide. The salt solution may include ferric chloride.

In one embodiment, surface treatments such as plasma etch or sputtering may be employed to remove any resin material present over the conductive material, or to give a rough and/or to clean the surface of the conductive material, which have reduced amounts of resin, or may be free of resin. Plasma etching or sputtering may treat the surface of the thermally conductive layer. Plasma etching, also known as dry etching, may be applied to clean substrate surfaces. The plasma contains highly excited molecules (reactive ions), which are chemically reactive. There is also a physical bombardment mechanism in that the ions may be accelerated towards the substrate surface with an electric field. Plasma etching may be anisotropic. Anisotropic means that the etching takes place in only one direction (line of sight).

During sputtering treatment of the surface, atoms of inert gas slam the target surface. Due to the collision, there is an exchange of momentum between the atoms of the target and the atoms of the inert gas. In the process, a target atom is ejected from the target and heads to the surface, which is subjected to treatment and sticks onto the surface. In one embodiment, metal sputtering may employ metal targets, such as, but not limited to titanium, molybdenum, tungsten, copper, aluminum, and combinations thereof.

In some embodiments, the percent of the exposed areas of the thermal transport layer in the slice that may include exposed portions of the thermal transport layer may be about 20 percent to about 80 percent, from about 30 percent to about 60 percent, from about 40 percent to about 60 percent, from about 40 percent and less than about 80 percent, based on the total area of the thermal transport structure.

Additional compliant layers may be provided between the surfaces of the slice and the heat-dissipating unit, the heat-generating unit, or both to facilitate adhesion, thermal transfer, or provide another desirable function. Suitable compliant layers may include one or more silanes, reactive silicones, or reactive siloxanes. Such adhesion promoters may have one or more functional groups that may include an amino group, a sulfur group, an alkoxy group, or the like. Silane adhesion promoters may be obtained commercially from, for example, GE Silicones (Pittsfield, Mass.) and Gelest, Inc. (Morrisville, Pa.). In one embodiment, the adhesion promoter may include one or more of 3-(2,3-epoxypropoxypropyl) trimethoxysilane, aminopropylmethoxy siloxane, silanol terminated siloxane, or triacetoxy methylsilane.

During assembly, the slice first surface may be coupled to the heat-generating unit and/or the slice second surface may be coupled to a heat-dissipating unit. Securing the slice surfaces to the heat units may include disposing the slice between the two units, and heating the slice.

During assembly using a thermal transport structure having a B-staged layer, a heat transfer surface may be aligned with a complimentary surface of the thermal transport structure, and the exposed surface of the B-staged resin layer may be secured thereto to form an assembly. During a post-assembly cure process, the B-stageable resin layer may soften and/or flow in response to heat to fill one or more gaps by a capillary flow action across the heat transfer surface. In one embodiment, the resin layer may be B-staged and may finish curing while the slice is interposed between the heat-generating unit and the heat-dissipating unit.

Suitable heat-dissipating units may include one or more of a heat sink, a heat radiator, a heat spreader, a lid, a heat pipe, or a Peltier heat pump. The heat-dissipating unit may be made of a thermally conductive material. Suitable materials may include one or more noble metals, or copper, nickel, or aluminum; or an alloy of aluminum, copper, or nickel.

Suitable heat-generating units may include one or more of an integrated chip, a power chip, power source, light source (e.g., LED, fluorescent, or incandescent), motor, sensor, capacitor, fuel storage compartment, conductor, inductor, switch, diode, or transistor. In one embodiment, the chip may include a flip chip configuration, or a chip on board configuration. The chip may be made of a semiconductor material, such as silicon.

The thermal transport structure may be disposed between the heat-generating unit and the heat-dissipating unit. The plane of the thermally conductive material of the thermal transport layer having the relatively higher value of thermal conductivities may be parallel to the direction of heat flow from the heat-generating unit to the heat-dissipating unit. The thermally conductive particles in the thermal transport layer slice may be aligned to facilitate and direct heat conduction. The thermally conductive particles in the thermal transport layer slice may be aligned to facilitate and direct heat conduction from the heat-generating unit to the heat-dissipating unit.

A B-stageable resin layer application process may be integrated into a manufacturing process back-end during the making of a heat-dissipating unit. Surface mount technology (SMT) may be employed in order to pre-apply a B-stageable resin layer onto a heat transfer surface. The resultant heat-dissipating unit, with the B-stageable resin layer applied and subsequently B-staged, may be aligned with, and adjacent to, a heat-generating unit, for example, an electronic device, for assembling them. Configurations useful for chip placement may include, for example, a flip chip configuration and/or a chip-on-board configuration.

FIG. 1 is an exploded view of one embodiment in which a thermal transport structure portion 10 may include a thermal transport layer 12 and a resin layer 18. The thermal transport layer 12 may have a first surface 14, and a second surface 16 opposite the first surface 14. The resin layer 18 may have a first surface 19 coupled to the second surface 16 of the thermal transport layer 12. Several of such portions 10 may be coupled together to form a stack 20, as illustrated in FIG. 2.

Figure 2:
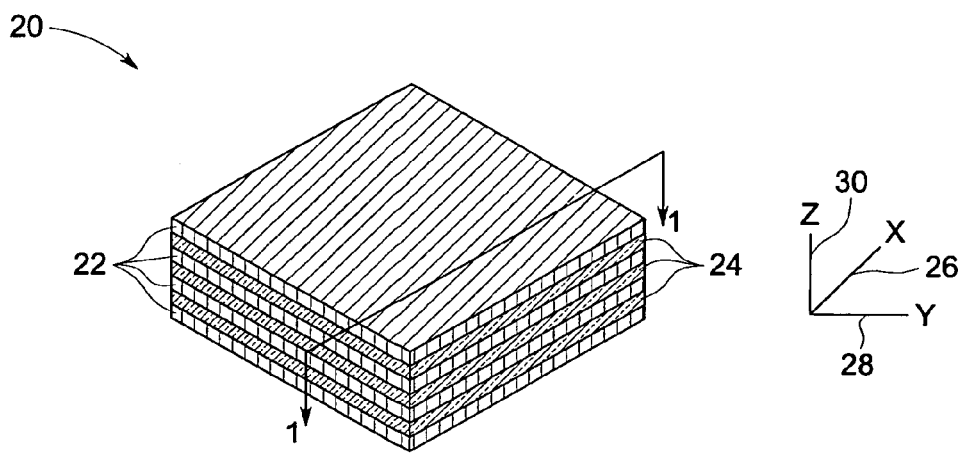
FIG. 2 is a schematic view of a stack of the layers of FIG. 1.

FIG. 2 illustrates an embodiment in which the stack 20 defines a composite structure. The composite structure may have a plurality of thermal transport layers 22 each alternating with a plurality of resin layers 24. The resin layers 24 may be secured to, and alternatingly disposed between, the thermal transport layers 22. The thermal transport layers 22 may be positioned such that the thermal conductivity of each of the thermal transport layers 22 may be relatively higher in an "in-plane" direction. "In-plane" direction may be represented by the x-y plane direction as shown by reference numerals 26 and 28. The in-plane conductivity may be greater compared to the conductivity in other directions that are skew to the indicated plane. The thermal transport layers 22 of the plurality may be formed from like material; in other embodiments, the thermal transport layers may be formed from differing materials. Similarly, the resin layers 24 either may be of like material or may differ.

Figure 3:
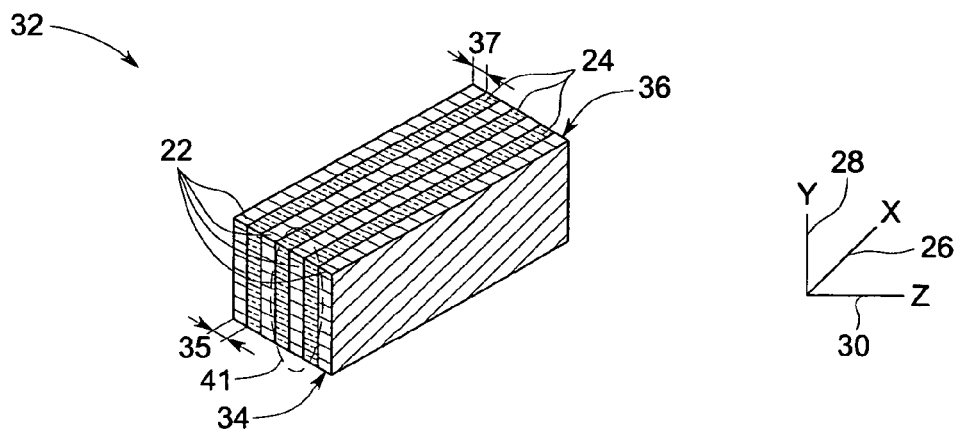
FIG. 3 is a schematic cross-sectional view of the structure of FIG. 2 taken along the line 1-1.

FIG. 3 illustrates a portion or a slice 32 of the stack 20, partitioned along the reference line 1-1 of FIG. 2. The slice 32 may be employed as a thermal transport structure. The slice 32 of the composite stack 20 exposes a first surface 34 at a first end 35 of the slice 32 at the thermal transport layer 22, and a second surface 36 at a second end 37 of the slice 32.

The thermal transport layer 22 may transfer heat from the slice first surface 34 to the slice second surface 36. The slice 32 may provide a path of least thermal resistance for thermal energy traveling from the first end surface 34 to the second end surface 36. The first end surface 34 may be coupled to a heat-generating unit (not shown), and the surface 36 may be coupled to a heat-dissipating unit (not shown). The thermal energy may flow downstream along the path through the thermal transport layers 22, from the first end surface 34 to the second end surface 36, or vice versa, under the influence of a temperature gradient or differential. That is, thermal energy may travel preferentially through the thermal transport layers 22, relative to the bounding resin layers 24. The defined path for thermal energy transport may allow for directional control of thermal energy flow.

Thermal energy that follows a shorter or more direct path, or that moves through material having relatively lower thermal resistance, may have to overcome relatively reduced thermal resistance. Where there is reduced thermal resistance, thermal transport efficiency may increase. Thermal energy attempting to travel laterally across bounding layers, or along a relatively longer path, may have a relatively increased thermal resistance to overcome.

The slice 32 may have a thickness that is sufficient to provide a short path for thermal energy going from heat-generating unit to the heat-dissipating unit. The slice 32 may be thick enough to insulate the heat-generating unit from the heat-dissipating unit. Such insulation may allow for control of the amount of heat transformed to the heat-dissipating unit within a given time.

Figure 4:
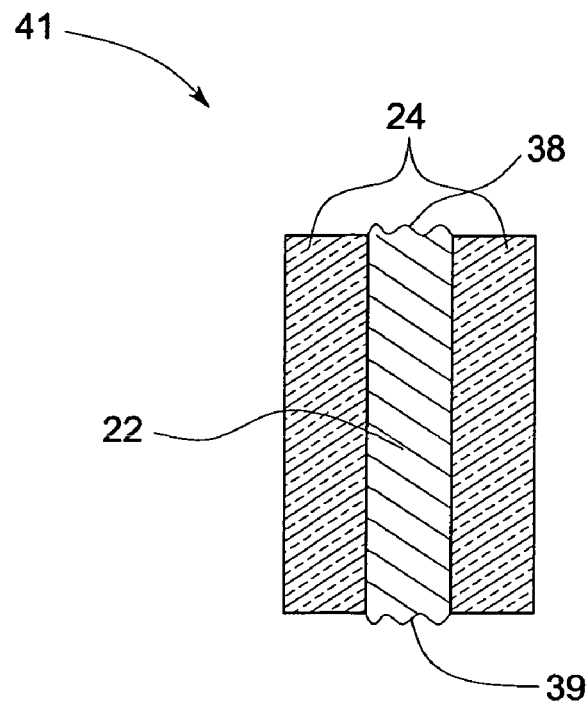
FIG. 4 is an enlarged view of a section of a slice of FIG. 3.

With reference to FIG. 4, first and second surfaces 38 and 39 of a portion 41 of a thermal transport structure may be seen. The surfaces 38 and 39 of the thermal transport layer 22 may be treated to provide enhanced coupling with corresponding surfaces of a heat-dissipating unit and/or a heat-generating unit.

Figure 5:
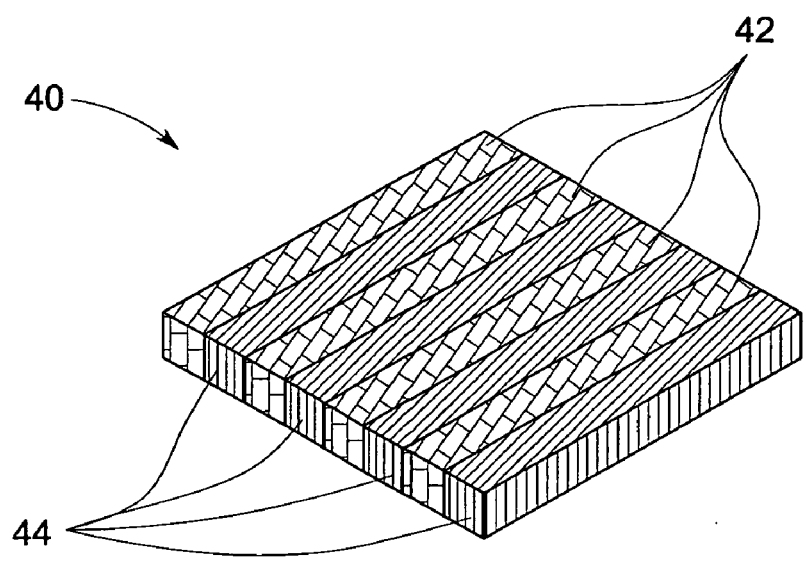
FIG. 5 is a schematic view illustrating thermal transport strips and resin strips arranged in an alternating array in accordance with an embodiment of the invention.

As illustrated in FIG. 5, a layer 40 of the thermal transport structure 32 may include alternating of thermally conductive material strips 42 and other strips 44 of a less thermally conductive material. In the illustrated embodiment, the strips 42, 44 may be of similar size and shape.

Figure 6:
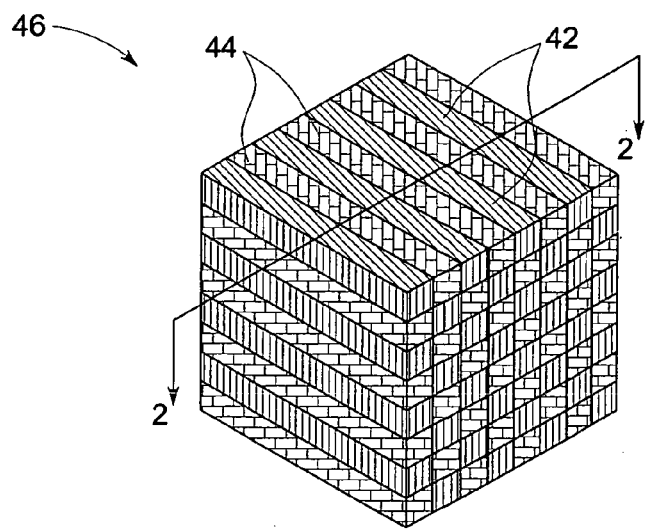
FIG. 6 is a schematic view of a stack formed by stacking the layers of FIG. 5.
Figure 7:
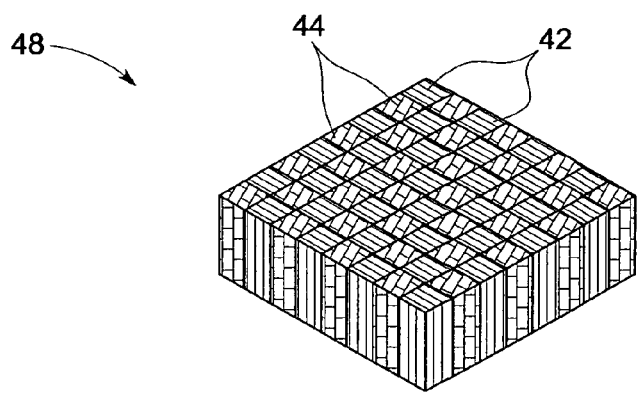
FIG. 7 is a schematic view of a slice cut away from the structure of FIG. 6 taken along the line 2-2.
Figure 8:
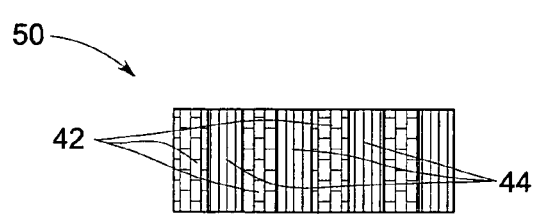
FIG. 8 is a side view of the slice of FIG. 7.

As illustrated in FIG. 6, several layers 40 as shown in FIG. 5 may form a stack 46 having a plurality of alternating thermally conductive strips 42 and less-conductive strips 44. The conductive strips may conduct thermal energy more efficiently in the x-y plane as compared to in other planes. The stack 46 may be cut along the 2-2 axis, and a portion 48 may be sliced out, as illustrated in FIG. 7. FIG. 7 illustrates the portion 48 laid horizontally as shown by the change in axis positions of axis x 26, y 28 and z 30. The sliced portion 48 may have a higher thermal conductivity in the x-y plane. The portion 48 may offer relatively less thermal resistance in the y-direction 28 (the through thickness direction). FIG. 8 illustrates a side view of the portion 48 of FIG. 7 having alternating thermally conductive strips 42 and less-conductive strips 44.

Figure 9:
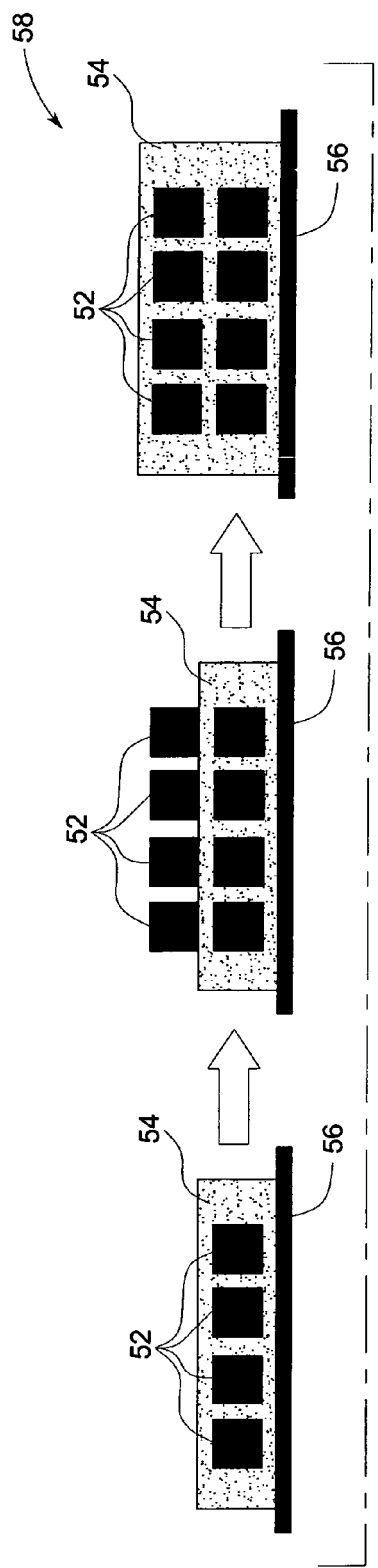
FIG. 9 is a schematic flow chart illustrating assembly of a thermal transport structure.
Figure 10:
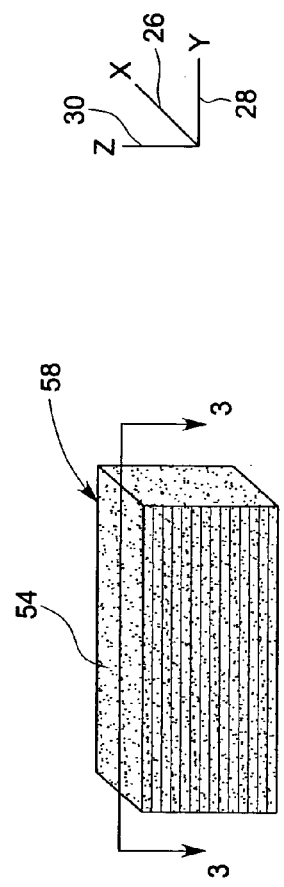
FIG. 10 is a schematic view of a structure formed by stacking the layers of FIG. 9.

With reference to FIG. 9, a schematic illustration shows bars 52 of thermally conductive material disposed in a non-conductive matrix 54 to form a structure 58. The structure 58 may be supported by a sacrificial substrate 56. The bars 52 may have about the same width as thickness, and may have a relatively large length relative to other dimensions. A perspective view of the layer 58 shown in FIG. 9 is illustrated in FIG. 10. The structure 58 may be sliced along, for example, a 3-3 axis to form a portion 60 shown in FIG. 11.

Figure 11:
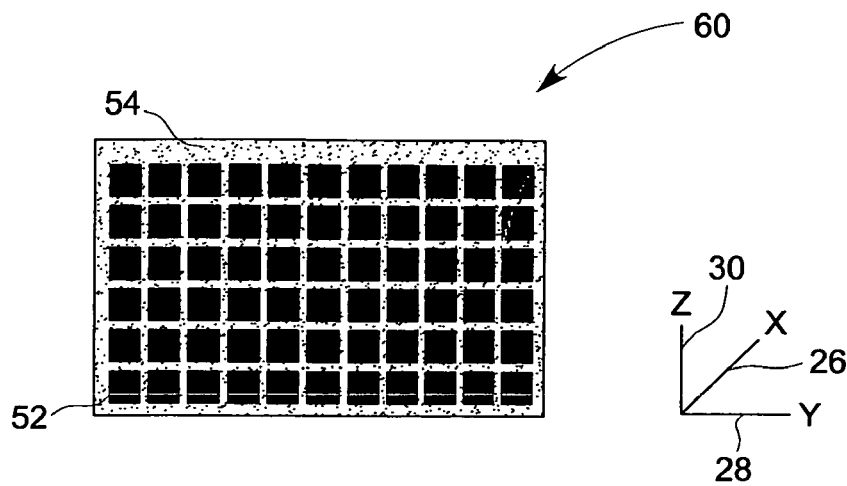
FIG. 11 is a schematic view of a slice cut away from the structure of FIG. 10 taken along the line 3-3.
Figure 12:
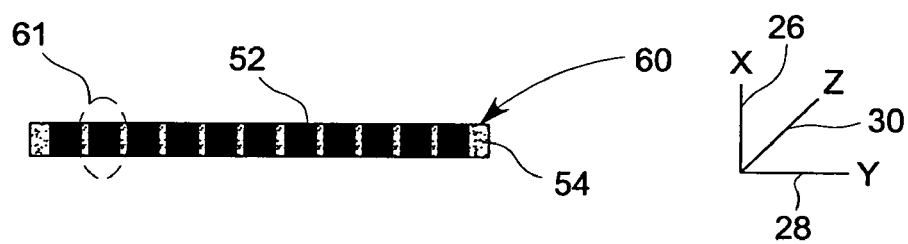
FIG. 12 is a side view of the slice of FIG. 11.

With reference to FIG. 11, the portion 60 may be then oriented to provide a greater thermal conductivity in the x-direction 26 (through thickness direction), as illustrated in FIG. 12.

Figure 13:
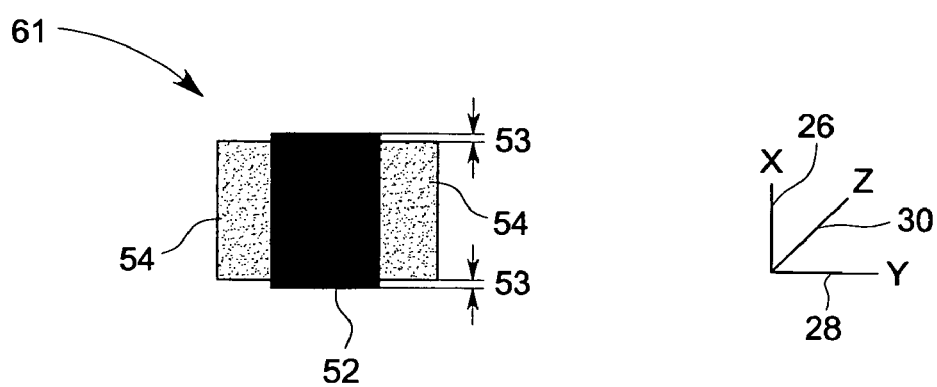
FIG. 13 is an enlarged view of a section of a slice of FIG. 12.

FIG. 13 illustrates an enlarged view of a portion 61 of thermal transport structure 58 of FIG. 12. The bar 52 of the thermally conductive material may be interposed between resin layers 54. The portions 53 of the bar 54 extending beyond the resin layer 54 may be formed as a result of surface treatment, that is, the portions 53 may be the portion of the bar 54, from where the resin layer may be removed during surface treatments.

Figure 14:
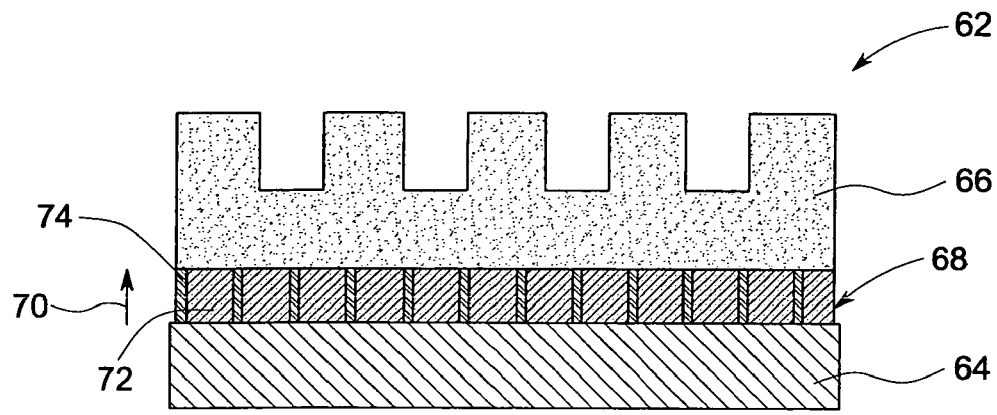
FIG. 14 is a schematic view of a thermal management system employing the thermal transport structure is an enlarged view of a section of a slice of FIG. 3 in accordance with an exemplary embodiment.

FIG. 14 illustrates a thermal management system 62 having a heat-generating unit 64, coupled to a heat-dissipating unit 66 via a thermal transport structure 68. The thermal transport structure 68 may transfer heat from the heat-generating unit 64 to the heat-dissipating unit 66.

The thermal transport structure 68 may include one or more thermal transport layers 72 defining thermal pathways from the heat-generating unit 64 to the heat-dissipating unit 66, as shown by arrow 70. The resin layers 74 may be secured to the thermal transport layers 72. The resin layers 74 may be in an alternating array with the thermal transport layers 72. The thermal management system 62 may be used in various chip configurations.

Figure 15:
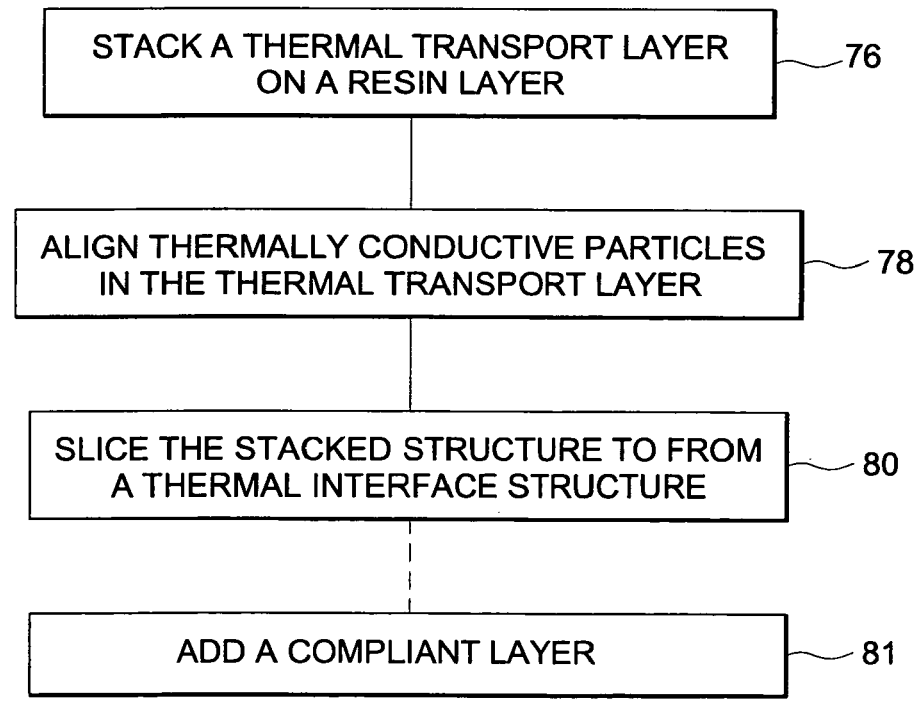
FIG. 15 is a flow chart illustrating steps involved in making a thermal transport structure in accordance with an exemplary embodiment.

A method for making a thermal transport structure, such as thermal transport structure 32 (see FIG. 3) is illustrated in FIG. 15. The method may include stacking a thermal transport layer on a resin layer to form a stacked structure (block 76). At block 78, thermally conductive particles in the thermal transport layer may be aligned to facilitate and direct heat conduction between the slice first surface and the slice second surface. At block 80, the stacked structure may be sliced to form a cross-sectional slice, having a first exposed portion of thermal transport layer on a first surface of the slice, and a second exposed portion of the thermal transport layer on the second surface of the slice. Optionally, at block 81, one or more compliant layers may be added on one or both surfaces of the slice.

EXAMPLES

Unless specified otherwise, ingredients are commercially available from such common chemical suppliers as Aldrich Chemical Company (Milwaukee, Wis.).

Example 1

In-Situ Thermal Characterization of Thermal Transport Structure

A resin layer is sprayed onto a sacrificial film. The resin layer is a mixture of an epoxy, RSL 1739 available from Hexion Specialty Chemicals (Houston, Tex.), and a hardener, hexahydro-4-methylphthalic anhydride available from Sigma-Aldrich (St. Louis, Mo.). The resin layer also includes a catalyst, Polycat SA-1 available from Air Products (Allentown, Pa.). Heat from a heat lamp at least partially cures the resin layer after spraying to form a film. Thermal pyrolytic graphite (TPG) bars are commercially available from GE Advanced Ceramics (Strongsville, Ohio) having dimension of 100 milimeters×100 milimeters and a thickness of about 2 milimeters are aligned on the resin layer. The thermal pyrolytic graphite (TPG) bars are aligned and areorientation such that the plane having the highest thermal conductivity is placed parallel to the sacrificial film. The process is repeated to form a stack having alternate layers of thermal pyrolytic graphite (TPG) and resin layer. The stack has dimensions of 100 milimeters×100 milimeters and a thickness of about 8 milimeters.

The stack is cured using a heat treatment for a period of 35 minutes at a temperature of 75 degrees Celsius. After cure, the stack is sliced into a thermal transport structure. The thickness of these slices is indicated in Table 1.

Grinding or polishing roughens a surface of the thermal transport structure. The ground surface is plasma etched and sputter etched to modify the surface further, and to remove any undesired binder or contaminate from the surface.

The thermal transport structure is attached to a bare silicon chip on one surface and a heat-dissipation device on another surface. The heat-dissipation device has a thermal transfer surface that is copper). An external pressure of 100 PSI is applied on the heat-dissipation device against the thermal transport structure to increase the thermal transfer rate.

Figure 16:
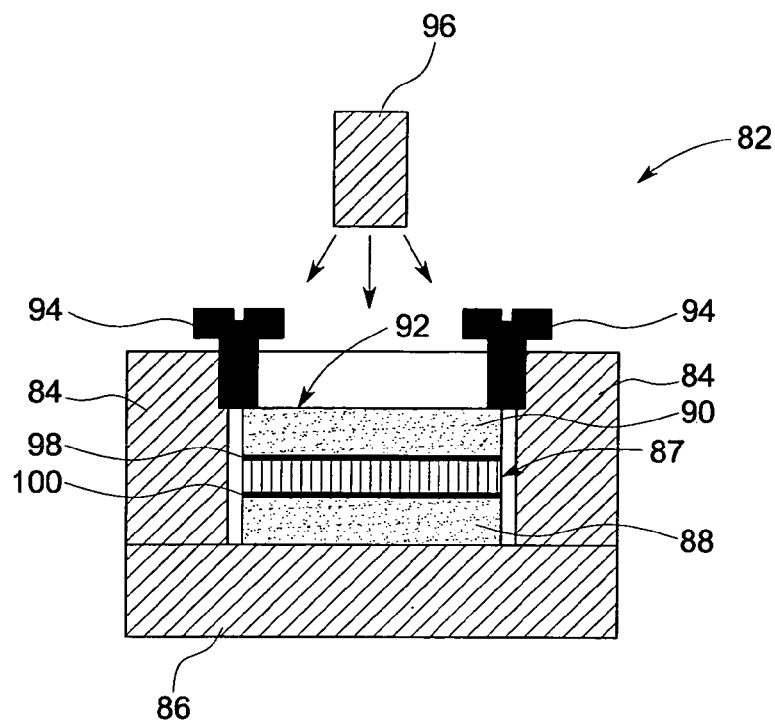
FIG. 16 is a schematic view of the experimental set up in accordance with an exemplary embodiment.

Reference number 82 in FIG. 16 indicates the experimental set up. The set up includes clamps 84 and 86. The dimensions of the thermal transport structure 87 are 8 millimeters×8 millimeters×500 micrometers thick. The thermal transport structure 87 is secured between copper substrates 88 and 90 to form a test coupon 92. The test coupon 92 includes liquid metal layers 98 and 100 disposed on the two sides of the thermal transport structure 87, and which serve as compliant layers. The liquid metal layers 98 and 100 increase adhesion between the thermal transport structure 87 and surfaces of the copper substrates 88 and 90. The test coupon 92 is fastened at the clamps using pressure screws 94 at the upper four corners of the test coupon 92.

The interfacial thermal resistance is characterized by an in-situ laser flash method during operation of the assembly. A laser source 96 shines a laser on the structure 87. During the laser flash measurement, a continuous pressure of 100 PSI is applied on the copper-thermal transport structure-copper tri-laminate test coupon 92 by pressure screws 94 located at each corner as illustrated in FIG. 16. Table 1 provides the thermal resistance values measured for Samples 1-4, which have different thicknesses of the copper layer and the thermal transport structures.

The copper layers each had a density of 8.82 grams per cubic centimeter (g/cm$^3$). The thermal transport structures each had a density of 2.26 grams per cubic centimeter. The copper layers each had a heat capacity of 0.382 Joules per gram Kelvin (J/gK). The thermal transport structures each had a heat capacity of 0.382 Joules per gram Kelvin.

TABLE 1

Results of tests for Sample 1 to Sample 4.

| Sample | Layers | Total thickness (mm) | Thickness (mm) | Thermal Diffusivity (cm$^2$/sec) | Resistance (mm$^2$-K/w) | Effective conductivity (W/m-K) |
|---|---|---|---|---|---|---|
| 1 | 1st Cu Layer | 2.138 | 0.8051 | 1.058 | 2.02 | 260.36 |
|   | TTS |  | 0.5249 | 1.620 |  |  |
|   | 2nd Cu Layer |  | 0.8080 | 1.058 |  |  |
| 2 | 1st Cu Layer | 2.138 | 0.8051 | 1.058 | 1.15 | 458.35 |
|   | TTS |  | 0.5249 | 2.860 |  |  |
|   | 2nd Cu Layer |  | 0.8080 | 1.058 |  |  |
| 3 | 1st Cu Layer | 2.135 | 0.8070 | 1.058 | 0.47 | 1104.42 |
|   | TTS |  | 0.5220 | 6.880 |  |  |
|   | 2nd Cu Layer |  | 0.8060 | 1.058 |  |  |
| 4 | 1st Cu Layer | 2.136 | 0.8100 | 1.058 | 0.36 | 1431.92 |
|   | TTS |  | 0.5180 | 8.920 |  |  |
|   | 2nd Cu Layer |  | 0.8080 | 1.058 |  |  |

Example 2

Effect of Thickness of Thermal Transport Layer on Interfacial Thermal Resistance In Example 2, thermal transport structures (TTS) are prepared in the same manner as in Example 1, except that the thickness of the thermal transport layer differs from sample to sample. Samples 5-7 have thickness of 490, 500, and 100 respectively.

Aligning each of the thermal transport structures between two substrates makes a test coupon. The plane of the TTS having the highest thermal conductivity is placed perpendicular to the substrates. The first substrate is an aluminum substrate having a density of 2.63 g/cm$^3$, heat capacity of 0.861 J/g-K, and a thermal conductivity of 130 W/m-K. The second substrate is a silicon substrate having a density of 2.33 g/cm$^3$, heat capacity of 0.70 J/g-K, and a thermal conductivity of 135 W/m-K.

Figure 17:
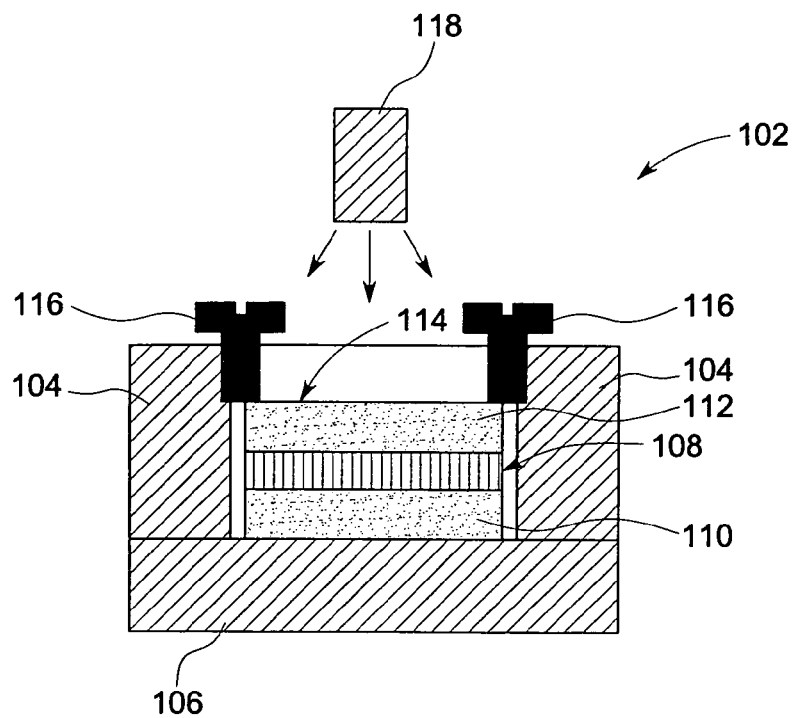
FIG. 17 is a schematic view of the experimental set up in accordance with an exemplary embodiment.

The experimental set up 102 is illustrated in FIG. 17. As with the set up 82 of FIG. 16, the set up 102 may include clamps 104 and 106. The TTS 108 is interposed between the aluminum and silicon substrates 110 and 112 to form a test coupon 114. The test coupon 114 is fastened to the clamps using pressure screws 116 at the upper four corners of the test coupon 114 as illustrated. A laser source 118 shines a laser on the structure. During the laser flash measurement, no external pressure is applied on the test coupons 114 by pressure screws 116. TTS samples are tested for thermal diffusivity, thermal conductivity and thermal resistance. The thermal resistance is measured by in-situ laser flash method. Table 2 lists the values measured for different thicknesses of the TTS. Each sample is measured more than once.

TABLE 2

Results of tests for Sample 5 to Sample 7.

| SAMPLE | TTS thickness (micrometers) | Thermal diffusivity (cm$^2$/s) | Thermal conductivity (W/m-K) | Thermal resistance (mm$^2$-K/W) |
|---|---|---|---|---|
| 5 | 490 | 0.21 | 16.2 | 30.2 |
| 5 | 490 | 0.24 | 19.5 | 25.1 |
| 6 | 500 | 0.25 | 20.3 | 24.6 |
| 6 | 500 | 0.20 | 15.5 | 32.3 |
| 6 | 500 | 0.23 | 18.2 | 27.5 |
| 6 | 500 | 0.21 | 16.2 | 30.9 |
| 7 | 1000 | 0.19 | 21.5 | 46.5 |
| 7 | 1000 | 0.15 | 16.0 | 62.5 |
| 7 | 1000 | 0.22 | 25.2 | 39.7 |
| 7 | 1000 | 0.15 | 16.8 | 59.4 |
| 7 | 1000 | 0.21 | 23.4 | 42.7 |

From the measurements, the TTS thickness is statistically significant for interfacial thermal resistance. The average thermal resistance for TTS having 500 micrometers thickness is 28.4 mm$^2$-K/W, whereas the average thermal resistance for TTS having 1000 micrometers thickness is 50.2 mm$^2$-K/W.

The foregoing examples are merely illustrative of some of the features of the invention. The appended claims are intended to claim the invention as broadly as it may have been conceived and the examples herein presented are illustrative of selected embodiments from a manifold of all possible embodiments. Accordingly it is Applicants' intention that the appended claims are not to be limited by the choice of examples utilized to illustrate features of the present invention. Where necessary, ranges have been supplied, those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A thermal transport structure, comprising:
   a thermal transport layer comprising a thermally conductive material and having a first surface and a second surface wherein each of the thermal transport layer first surface and second surface are outward-facing surfaces of the thermal transport layer that are configured to contact a heat-generating unit or a heat-dissipating unit, and the thermally conductive material is oriented in a predetermined direction to directionally facilitate heat conduction in a direction substantially perpendicular to the predetermined direction wherein the thermal transport layer comprises a plurality of individual thermally conductive strips of substantially uniform thickness that are disposed in an alternating array with a plurality of individual relatively non-thermally conductive strips of substantially uniform thickness, and at least one of the thermally conductive strips comprises thermal pyrolytic graphite and has no resin layer present between the thermal transport layer first surface and second surface; and
   a resin layer secured to the thermal transport layer second surface, and the resin layer is relatively less thermally conductive than the thermal transport layer, and
   wherein the thermal transport layer is one of a plurality of thermal transport layers, and each of the plurality of thermal transport layers has a first surface and a second surface, and in each of the plurality of thermal transport layers the thermally conductive material in each thermally conductive strip is oriented in a determined direction to directionally facilitate heat conduction relative to the determined direction, and the resin layer is one of a plurality of resin layers, and each of the plurality of resin layers is relatively less thermally conductive than any one of the plurality of thermal transport layers; and each of the plurality of the thermal transport layers and each of the plurality of resin layers are arranged alternating to each other.

2. The thermal transport structure as defined in claim 1, wherein the resin layer is a film.

3. The thermal transport structure as defined in claim 1, wherein the thermal transport layer has a thickness in a range of less than about 1000 micrometers.

4. The thermal transport structure as defined in claim 1, wherein the resin layer has a thickness in a range of greater than about 1000 micrometers.

5. The thermal transport structure as defined in claim 1, wherein a bulk resistance of the thermal transport layer having a thickness of about 500 micrometers is less than about 25 mm$^2$-K/w.

6. The thermal transport structure as defined in claim 1, wherein the thermal transport layer and the resin layer form a composite, which is sliced in cross section, and a cross-sectional slice of the composite exposes a first end of the thermal transport layer on a first surface of the slice and a second end of the thermal transport layer on a second surface of the slice, wherein the thermal transport layer is operable to transfer heat directionally perpendicular to a first surface of the slice and a second surface of the slice.

7. The thermal transport structure as defined in claim 6, wherein the slice may have a thickness in a range of less than about 1000 micrometers.

8. The thermal transport structure as defined in claim 6, wherein the slice may have a thickness in a range of less than about 500 micrometers.

9. The thermal transport structure as defined in claim 6, wherein a surface of the slice is modified by etching or sputtering.

10. The thermal transport structure as defined in claim 6, wherein a surface of the slice comprises one or more exposed portions of the thermal transport layer.

11. The thermal transport structure as defined in claim 10, wherein an amount of the surface of the slice that comprises the exposed portions of the thermal transport layer is more than 60 percent of the surface area.

12. The thermal transport structure as defined in claim 1, the resin layer, the thermal transport layer, or both the resin layer and the thermal transport layer are cured.

13. The thermal transport structure as defined in claim 1, the resin layer, the thermal transport layer, or both the resin layer and the thermal transport layer are a film comprising a thermoplastic material or a B-staged resin.

14. The thermal transport structure as defined in claim 1, wherein the thermal transport layer comprises a binder.

15. The thermal transport structure as defined in claim 14, wherein the binder comprises one or more additives.

16. The thermal transport structure as defined in claim 1, wherein the thermally conductive material consists essentially of thermal pyrolytic graphite.

17. The thermal transport structure as defined in claim 1, wherein the resin layer, the thermal transport layer, or both layers comprise a filler.

18. The thermal transport structure as defined in claim 17, wherein the filler comprises one or more of boron, aluminum, copper, nickel, or combinations thereof.

19. The thermal transport structure as defined in claim 17, wherein the filler comprises one or more of an oxide, a nitride, a boride, or combinations thereof.

20. The thermal transport structure as defined in claim 17, wherein the filler is electrically insulative.

21. The thermal transport structure as defined in claim 17, wherein the filler comprises spherical particles.

22. The thermal transport structure as defined in claim 17, wherein the filler comprises particles, each having a length that differs from a width.

23. The thermal transport structure as defined in claim 22, wherein the particles are directionally oriented relative to a plane defined by the thermal transport layer.

24. A pre-formed structure for transporting thermal energy, comprising:
   a sliced portion having a first surface and a second surface; and
   one or more discontinuous portions of thermal transport layers that extend from the sliced portion first surface through the sliced portion to the sliced portion second surface; and wherein the one or more discontinuous portions of thermal transport layers transport heat directionally perpendicular to at least one of the sliced portion first or second surfaces.

* * * * *